United States Patent
Blum et al.

(10) Patent No.: US 9,461,390 B2
(45) Date of Patent: Oct. 4, 2016

(54) I/O CONNECTOR WITH INTEGRATED ADJUSTABLE SET SCREW

(71) Applicant: Apple Inc., Cupertino, CA (US)

(72) Inventors: Matthew W. Blum, San Francisco, CA (US); Stephen V. Jayanathan, Oakland, CA (US)

(73) Assignee: Apple Inc., Cupertino, CA (US)

( * ) Notice: Subject to any disclaimer, the term of this patent is extended or adjusted under 35 U.S.C. 154(b) by 269 days.

(21) Appl. No.: 14/269,027

(22) Filed: May 2, 2014

(65) Prior Publication Data

US 2015/0316090 A1 Nov. 5, 2015

(51) Int. Cl.
| | |
|---|---|
| *G06F 1/16* | (2006.01) |
| *H01R 13/44* | (2006.01) |
| *F16B 35/00* | (2006.01) |
| *H05K 5/00* | (2006.01) |
| *H05K 13/04* | (2006.01) |
| *F16B 23/00* | (2006.01) |

(52) U.S. Cl.
CPC ............ *H01R 13/44* (2013.01); *F16B 35/005* (2013.01); *G06F 1/16* (2013.01); *H05K 5/0004* (2013.01); *H05K 13/04* (2013.01); *F16B 23/0038* (2013.01); *Y10T 29/49131* (2015.01)

(58) Field of Classification Search
CPC ............................. G06F 1/1656; H01R 13/44
USPC .......................... 439/131, 135, 136, 142, 143
See application file for complete search history.

(56) References Cited

U.S. PATENT DOCUMENTS

| | | | |
|---|---|---|---|
| 6,435,903 B1 * | 8/2002 | Nelson ................... | H01R 13/71 174/57 |
| 6,893,196 B2 * | 5/2005 | Wille .................. | F16B 19/1072 411/183 |
| 7,014,227 B2 * | 3/2006 | Strangward ......... | E05B 65/0057 27/DIG. 1 |
| 7,072,624 B2 * | 7/2006 | Zheng ................. | H04M 1/0252 361/814 |
| 7,501,573 B2 * | 3/2009 | Balfour, Jr. ............ | H02G 9/025 109/53 |
| 8,434,798 B2 * | 5/2013 | Hsiung ................ | H05K 5/0008 292/1 |
| 2008/0007902 A1 * | 1/2008 | Kim ...................... | G06F 1/1616 361/679.08 |
| 2008/0259537 A1 * | 10/2008 | Arisaka ................... | G06F 1/203 361/679.08 |
| 2009/0160199 A1 * | 6/2009 | Ramsauer ................. | E05B 9/08 292/256 |
| 2014/0092532 A1 * | 4/2014 | Kole ................... | H04M 1/0249 361/679.01 |
| 2014/0120751 A1 * | 5/2014 | Senatori ................ | G06F 1/1656 439/131 |
| 2014/0146452 A1 * | 5/2014 | Chu ...................... | H05K 5/0008 361/679.01 |

* cited by examiner

*Primary Examiner* — Adrian S Wilson
(74) *Attorney, Agent, or Firm* — Downey Brand LLP

(57) ABSTRACT

An externally accessible component in an electronic device is described. The component may be installed within an enclosure without being properly aligned with an opening of the enclosure. A tool external to the electronic device may be inserted into the component and into a rear member located behind the component. The tool may actuate the rear member in a manner that actuates the component to move in a direction toward the opening, in order to align the component with the opening. A method of aligning the component is also described.

20 Claims, 10 Drawing Sheets

I/O CONNECTOR WITH INTEGRATED ADJUSTABLE SET SCREW

FIELD

The described embodiments relate generally to installation of an internal component in an electronic device. In particular, the present embodiments relate to an externally accessible component within the electronic device that may be adjusted and/or aligned using a tool that is external with respect to the electronic device. The tool may be inserted into an opening of the electronic device and into the component.

BACKGROUND

Electronic devices may include a uni-body enclosure. In other words, the enclosure is a uniform, single piece. The enclosure is made from a block or ingot milled or machined to remove materials in order to create a hollow portion to receive multiple components of the electronic device. The uni-body enclosure may be a more robust, and more aesthetic, design as compared to an enclosure having a top portion attached to a bottom portion. Also, the uni-body enclosure further reduces areas where contaminants may enter the electronic device.

However, alignment of components into a uni-body enclosure may be more difficult than traditional two-part enclosures. For example, once the component is installed within the uni-body enclosure, it may be difficult to align the component by manual or automate means, primarily due to the relatively small cavity. Whereas traditional electronic devices allow for alignment of components prior to assembling the top portion to the bottom portion, the uni-body enclosure has relatively limited areas for alignment. Accordingly, limited means for alignment may render certain components misaligned, or aligned in an unideal manner. Also, the uni-body enclosure may require undesirable design specification changes in order to accommodate certain components.

SUMMARY

In one aspect, a self-aligning component that engages an enclosure of an electronic device is described. The self-aligning component includes a cavity extending from a first end of the self-aligning component to a second end of the self-aligning component. The second end may be engaged with a rear member in the electronic device, and the self-aligning component may traverse from a first position to a second position when a tool engages and actuates the rear member.

In another aspect, a method of aligning a component in an enclosure of an electronic device is described. The method may include inserting the component within a portion of the enclosure; the component may have a first end and a second end opposite the first end, and the first end may have a first opening that opens to a cavity. The method may also include engaging a tool with a rear member proximate to the second end. The method may also include actuating the tool; actuating the tool may actuate the rear member. The method may also include actuating the component in a direction toward the enclosure.

In another aspect, an electronic device having a movable member configured to align after the movable member is installed is described. The electronic device may include a component having a first end, a second end opposite the first end, and a cavity extending between the first end and the second end. The electronic device may also include an enclosure having an opening that receives a portion of the first end. The electronic device may also include a rear member engaged with the second end. Also, the component may move along a substrate in the electronic device when a rotary tool rotates the rear member.

Other systems, methods, features and advantages of the embodiments will be, or will become, apparent to one of ordinary skill in the art upon examination of the following figures and detailed description. It is intended that all such additional systems, methods, features and advantages be included within this description and this summary, be within the scope of the embodiments, and be protected by the following claims.

BRIEF DESCRIPTION OF THE DRAWINGS

The disclosure will be readily understood by the following detailed description in conjunction with the accompanying drawings, wherein like reference numerals designate like structural elements, and in which.

Those skilled in the art will appreciate and understand that, according to common practice, various features of the drawings discussed below are not necessarily drawn to scale, and that dimensions of various features and elements of the drawings may be expanded or reduced to more clearly illustrate the embodiments of the present invention described herein.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting such that other embodiments may be used, and changes may be made without departing from the spirit and scope of the described embodiments.

The following disclosure relates to a component (in an electronic device) configured for adjustment and/or alignment by an external tool inserted into the component. The component may be positioned proximate to an opening in an enclosure of the electronic device. The tool passes through an opening of the component and engages a rear member positioned proximate to the component. The rear member is actuated by actuating the tool. By doing so, the rear member and the component are configured to traverse in a direction toward the opening of the enclosure. When the component is properly adjusted and/or aligned with the opening of the enclosure, the tool may be removed.

These and other embodiments are discussed below with reference to FIGS. 1-16. However, those skilled in the art will readily appreciate that the detailed description given herein with respect to these Figures is for explanatory purposes only and should not be construed as limiting.

Figure 1:
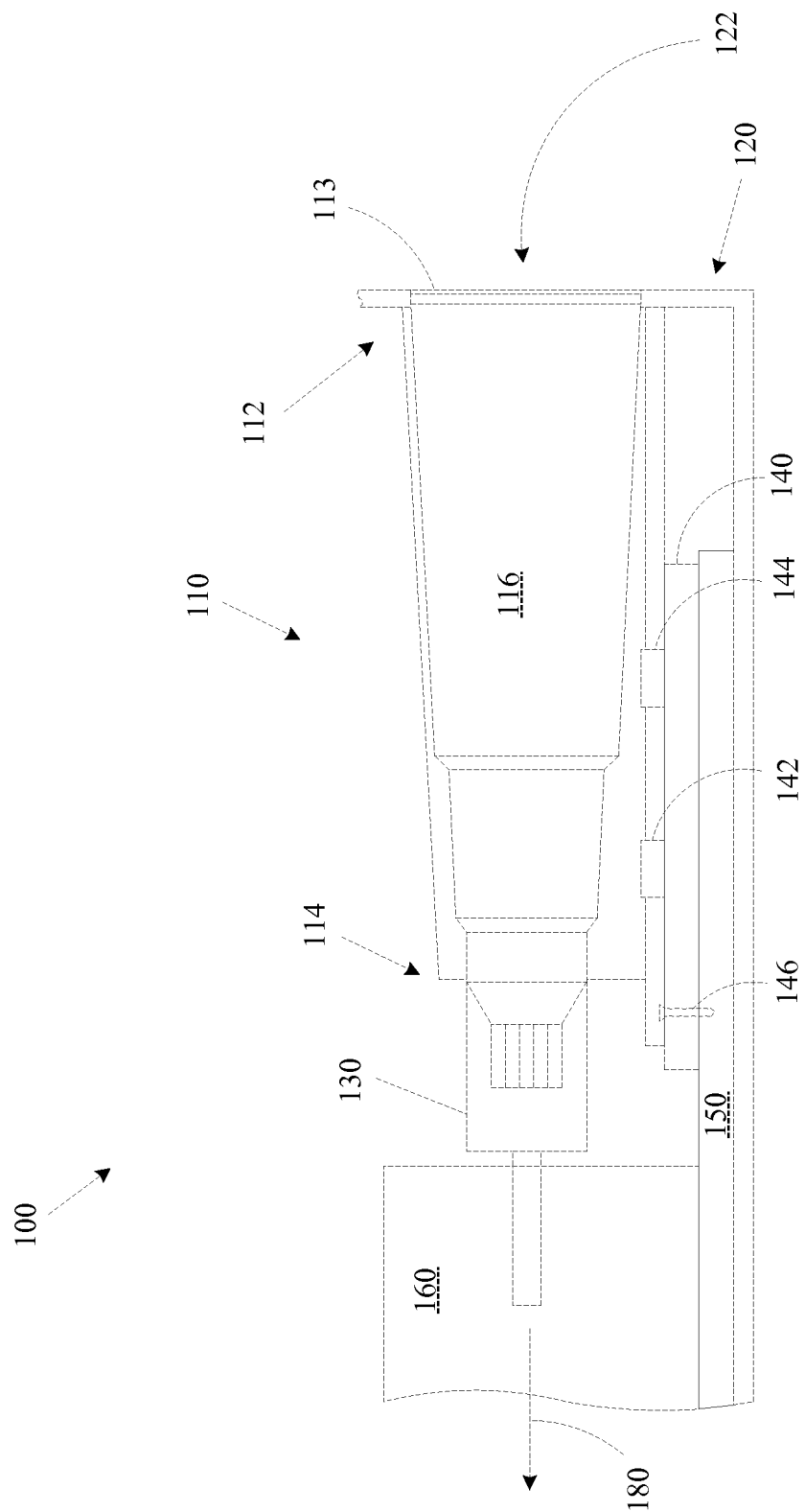
FIG. 1 shows a side view of an embodiment of a component and a rear member in an electronic device.

FIG. 1 illustrates an electronic device 100, or simply device 100, having component 110 installed and aligned with opening 122 of enclosure 120 using rear member 130. In some embodiments, device 100 is a desktop computing device, such as an iMac device from Apple, Inc., of Cupertino, Calif. In other embodiments, device 100 a portable computing device, such as a MacBook® device from Apple, Inc., of Cupertino, Calif. Still, in other embodiments, device 100 is a mobile communications device or a smartphone, such as an iPhone® device, or a table computing device, such as an iPad® device, both of which are from Apple, Inc., of Cupertino, Calif. Yet in other embodiments, component 110 is enclosed within a keyboard.

In some embodiments, component 110 is a data port configured to receive a communication channel such that device 100 may communicate with another electronic device. In other embodiments, component 110 is a power port configured to receive an electric current from an external power supply. In the embodiment shown in FIG. 1, component 110 is an audio jack configured to transmit audio to an audio speaker (not shown). Generally, component 110 is any component that may be adjusted and/or aligned by an external tool (not shown) to engage enclosure 120. Also, component 110 may be an input-output ("I/O") connector known in the art on an electronic device. Generally, component 110 includes cavity 116 configured to receive a tool (shown later). Also, while enclosure 120 discussed in this detailed description is a uni-body enclosure having a hollow interior portion, in other embodiments, enclosure 120 could include two or more portions assembled together to form a device 100.

FIG. 1 also shows component 110 mounted on substrate 140. In some embodiments, substrate 140 is a flexible circuit. In the embodiment shown in FIG. 1, first substrate 140 is a printed circuit board ("PCB"). Generally, substrate 140 may be any structure configured assist in vertical alignment of component 110. Also, first substrate 140 includes first rail member 142 and second rail member 144, both of which are configured to allow component 110 to slide along substrate 140 generally in a linear direction toward opening 122. Substrate 140 may be secured to second substrate 150 by mounting screw 146. Second substrate 150 may be any structure previously described for first substrate 140.

FIG. 1 further shows component 110 engaged with opening 122 of enclosure 120. Advances in molding techniques allow for component 110 to be made with relatively small tolerances such that first end 112 of component 110 may fit into opening 110 with minimal gaps, or spaces, between first end 112 and opening 122. First end 112 is generally shaped to correspond to the shape of opening 122 and an opening of component 110. First end 112 may be made from relatively rigid materials (e.g., aluminum or plastic) configured to protect component 110 from repeated insertion of, for example, an audio plug. Also, first 112 may include ring element 113 that provides further protection and/or allows to device 100 to achieve a certain desired aesthetic effect. Ring element 113 be made of the same materials previously described for first end 112.

Generally, rear member 130 is a structure configured to rotate around a longitudinal axis of rear member 130 (shown later). For purposes of clarity, the term "longitudinal" as used throughout this detailed description and in the claims refers to a direction extending a length or major axis of a component. In some embodiments, rear member 130 is a set screw used to secure an object (such as component 110) within or against another object (such as opening 122).

As shown in FIG. 1, rear member 130 is positioned proximate to a second end 114 of component 110. Also, a portion of rear member 130 is engaged with internal component 160. Internal component 160 may be any internal component within device 110 capable of receiving rear member 130. When component 110 is installed into enclosure 120, component 110 is grossly positioned proximate to opening 122. However, when a tool (not shown) passes through second end 114 of component 110 and into rear member 130, rear member 130 is configured to actuate, or rotate, when the tool is actuated. When actuated, rear member 130 generally moves in a direction away from internal component 160 toward opening 122 in order to adjust and/or align component 110 with opening 122.

As shown in FIG. 1, rear member 130 has a shape that generally corresponds to the shape of second end 114 of component 110. Rear member 130 could include a different shape in order to correspond to a different shape of a component. In other words, a portion of rear member 130 receives a portion of component 110 having a similar shape as rear member 130. In the embodiment shown in FIG. 1, rear member 130 is generally round. Second end 114 may be made of any material previously described for first end 112. Also, it should be understood that first end 112 and second end 114 are only intended for purposes of description and are not intended to demarcate precise regions.

Figure 3:
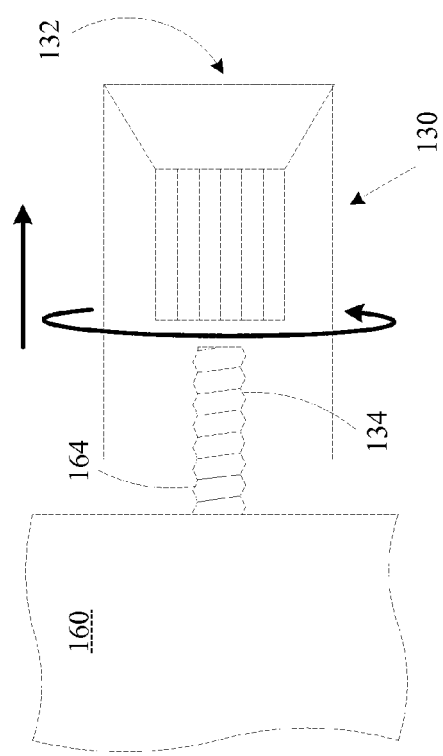
FIG. 3 shows a side view of an alternative embodiment of a rear member configured to actuate a component in an electronic device.
Figure 2:
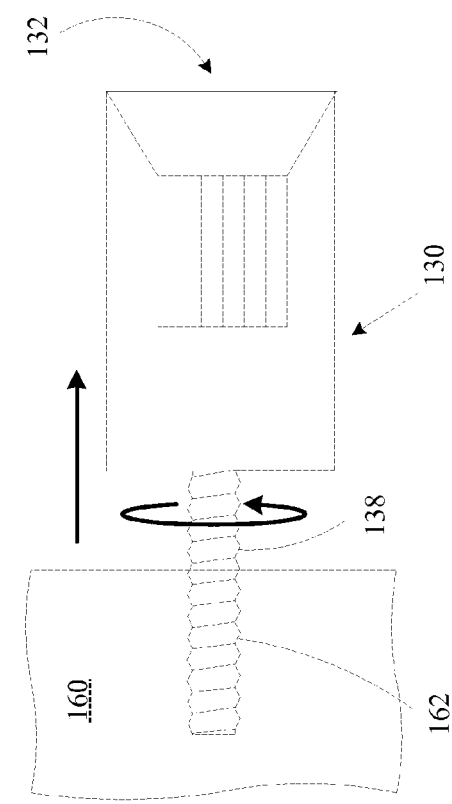
FIG. 2 shows a side view of an embodiment of a rear member configured to actuate a component in an electronic device.

FIGS. 2 and 3 illustrate side views different embodiments of rear member 130. FIG. 2 shows rear member 130 as a unitary member having threaded portion 138 in threaded engagement with internal threads 162 of internal component 160. When a tool, inserted into first end 132 of rear member 130, is rotated, rear member 130 rotates in a direction away from internal component 160. FIG. 3 shows an alternative embodiment of rear member 130 having internal threads 134. Internal threads 134 are in threaded engagement with (stationary) threaded protrusion 164 of internal component 160. When a tool, inserted into first end 132 of rear member 130, is rotated, rear member 130 rotates with respect to threaded protrusion 164 in a direction away from internal component 160.

Generally, rear member 130 is made of polymeric material such as plastic. However, in other embodiments, rear member 130 may be made from a magnetically metallic material, or materials. In this manner, the tool may actuate rear member 130 through magnetic attraction, causing rear member 130 to actuate a component toward an opening of an enclosure. In some embodiments, rear member 130 may be free of threaded portions.

Figure 4:
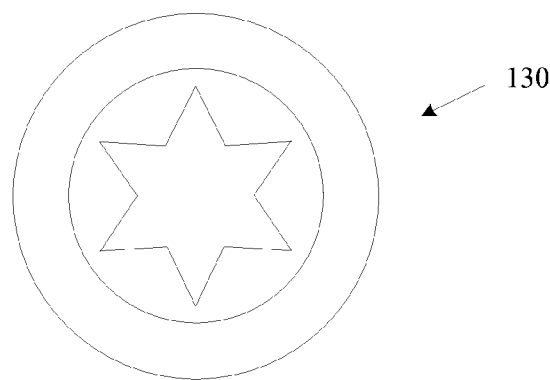
FIG. 4 shows a front view of an embodiment of a rear member configured to receive an embodiment of a tool used to actuate the rear member.
Figure 5:
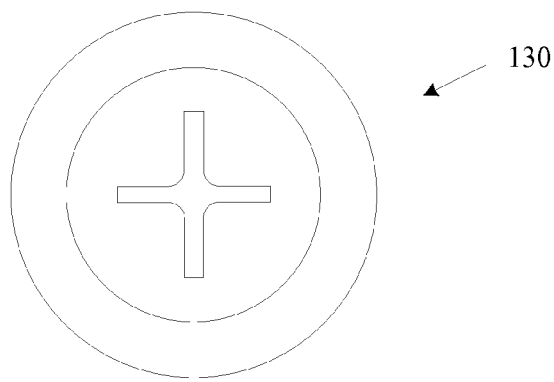
FIG. 5 shows a front view of another embodiment of a rear member configured to receive an embodiment of another tool used to actuate the rear member.
Figure 6:
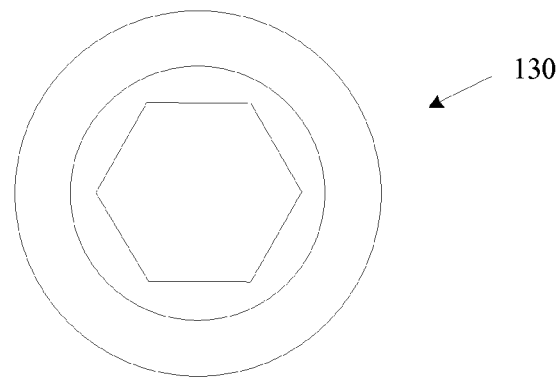
FIG. 6 shows a front view of another embodiment of a rear member configured to receive an embodiment of another tool used to actuate the rear member.

Rear member 130 may be configured to receive a tool having a particular shape. For example, FIGS. 4-6 illustrate front view of different embodiments of rear member 130. FIG. 4 illustrates an embodiment of rear member 130 having an internal portion configured to receive a tool such a six-sided tool, such as a T5 screwdriver. FIG. 5 illustrates another embodiment of rear member 130 having an internal portion configured to receive a four-sided tool, such as a Philips screwdriver. FIG. 6 illustrates another embodiment of rear member 130 having an internal portion configured to receive another six-sided tool, such as an Allen wrench. The embodiments of rear member 130 shown in FIGS. 4-6 may be configured to have either embodiment of a threaded mechanism shown in FIG. 2 or FIG. 3. Further, the embodiments of rear member 130 may include a magnetically attractable material, or materials, as previously described.

Figure 7:
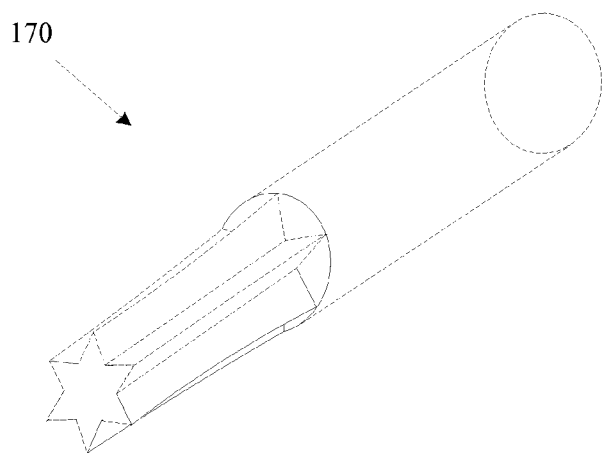
FIG. 7 shows an isometric view of an embodiment of a tool use to actuate the rear member shown in FIG. 4.
Figure 8:
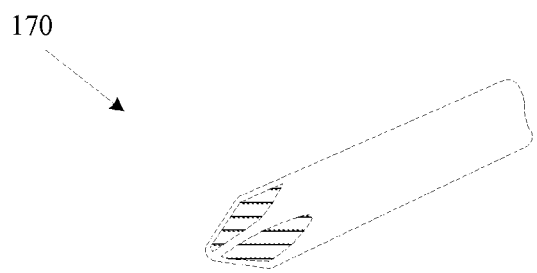
FIG. 8 shows an isometric view of another embodiment of a tool use to actuate the rear member shown in FIG. 5.
Figure 9:
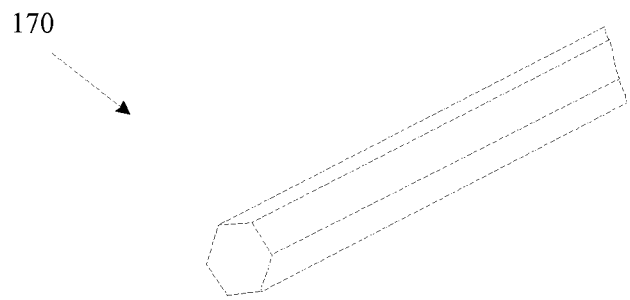
FIG. 9 shows an isometric view of another embodiment of a tool use to actuate the rear member shown in FIG. 6.

FIGS. 7-9 illustrate a portion of tool 170 used to drive a rear member previously described. FIG. 7 shows an embodiment of tool 170 having a six-sided structure and configured to drive rear member 130 shown in FIG. 4. FIG. 8 shows an embodiment of tool 170 having a four-sided structure and configured to drive rear member 130 shown in FIG. 5. FIG. 9 shows an embodiment of tool 170 having another six-sided structure and configured to drive rear member 130 shown in FIG. 6. Although various embodiments are shown, tool 170 could be any structure generally known in the art for driving a threaded member. Also, in some embodiments, tool 170 is attached to a handheld member for manual actuation. In other embodiments, tool 170 is attached to structure having a rotary device for motorized actuation; the rotary device could be a handheld tool or could be part of an assembly line configured to assembly an electronic device.

Figure 10:
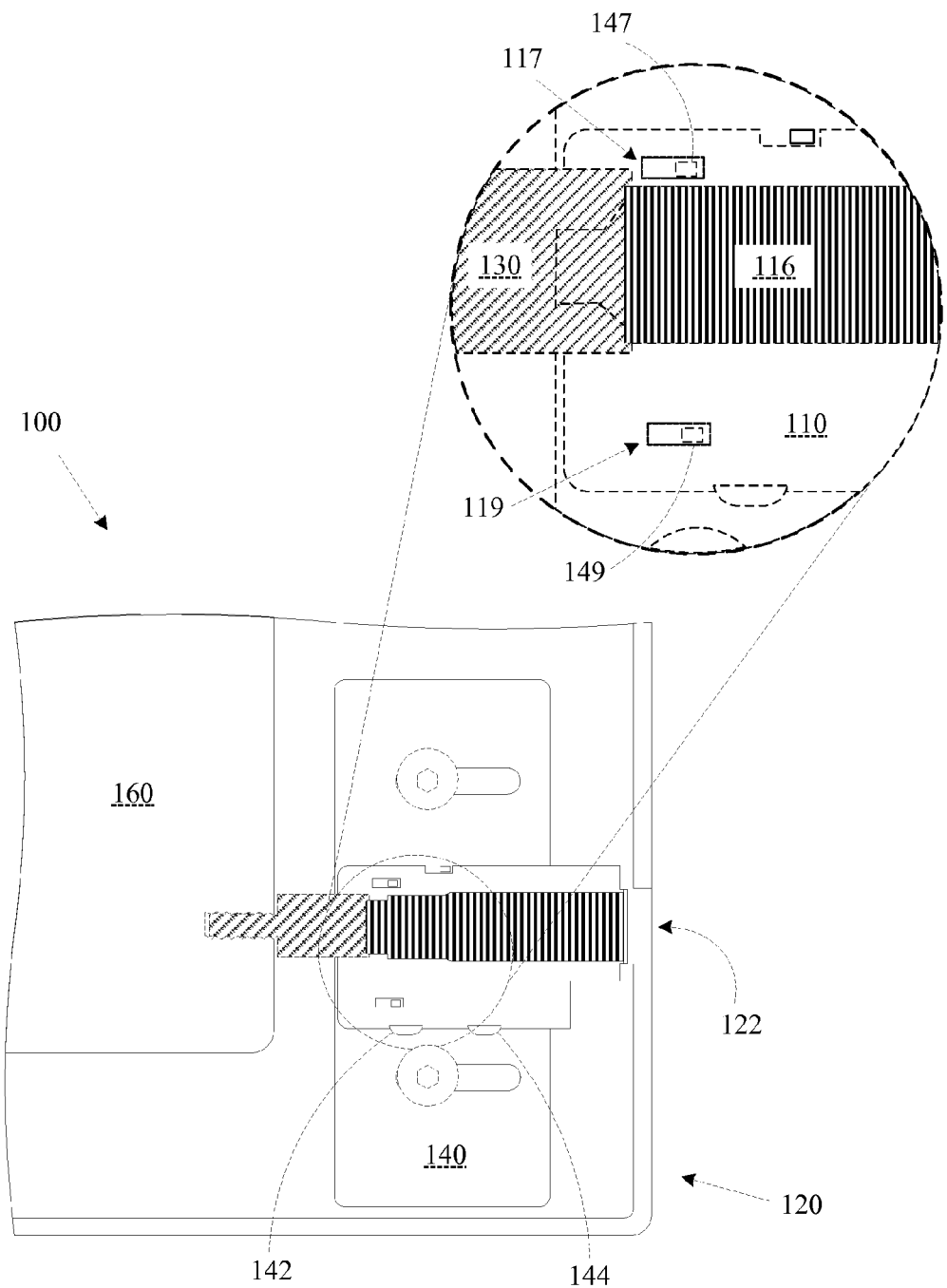
FIGS. 10-12 illustrate a method for aligning a component with an enclosure of an electronic device in accordance with the described embodiments.
Figure 11:
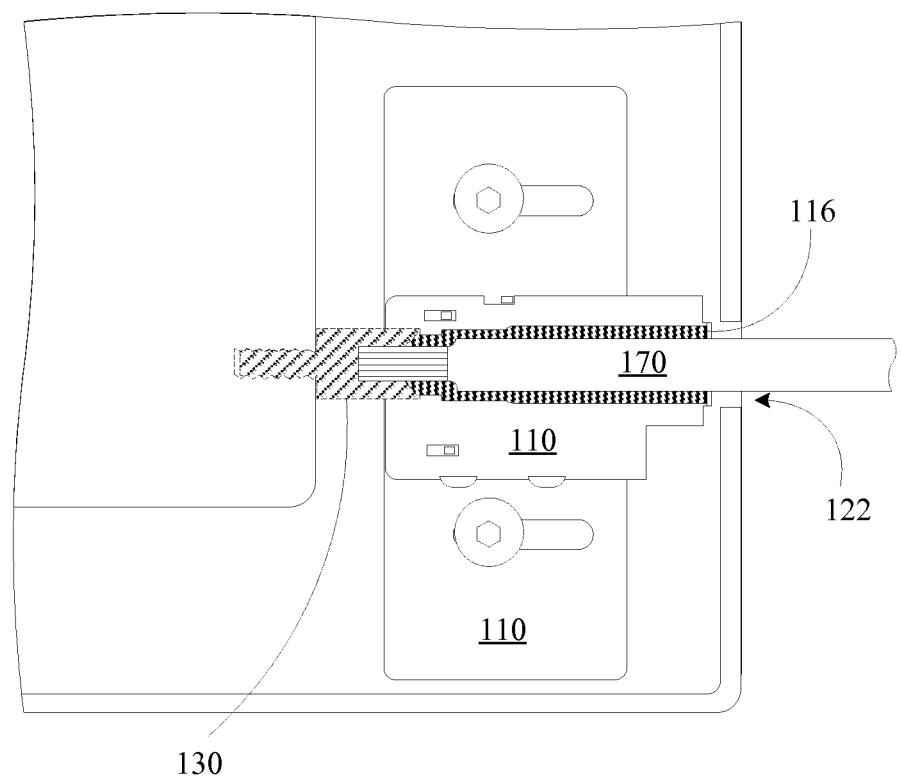
Figure 12:
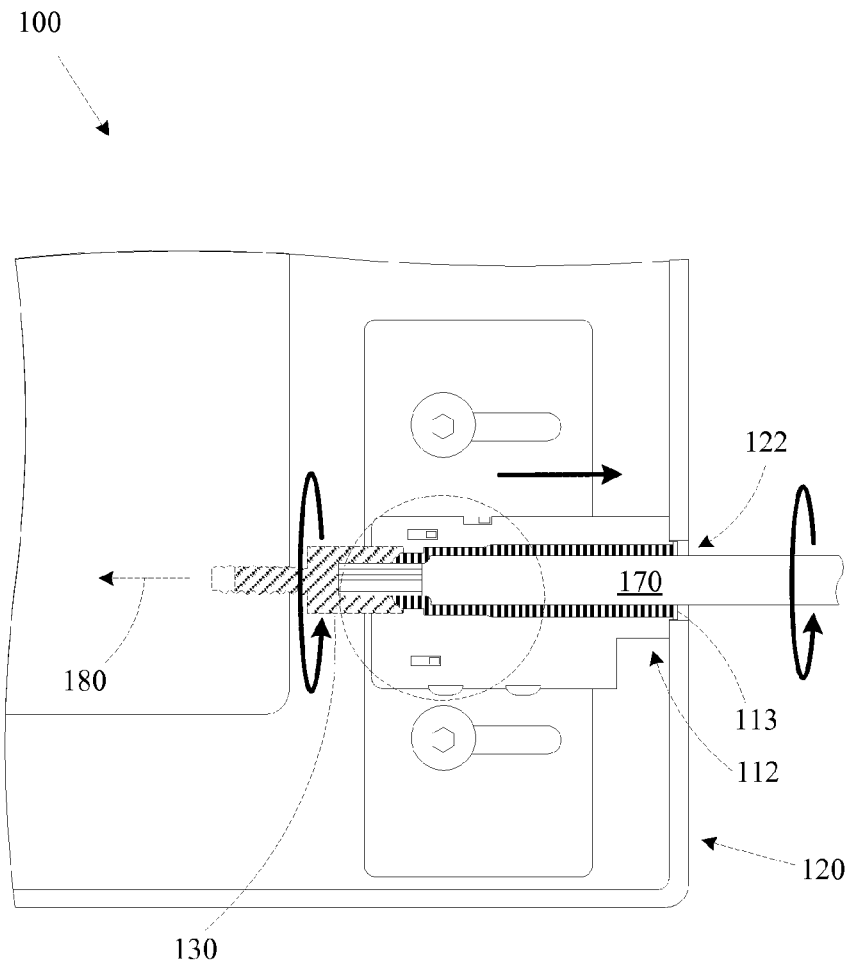

FIGS. 10-12 illustrate a method for adjusting and/or aligning component 110 with opening 122 of enclosure 120. For purposes of clarity, a cross section of rear member 130 and cavity 116 are shown. In FIGS. 10-12, rear member 130 could be any structure previously described in engagement with internal component 160, and could include any shape previously described for receiving a tool. Also, tool 170, shown in FIGS. 11 and 12, could include any combination of features previously described in order to actuate rear member 130.

FIG. 10 shows a top view of device 100 having component 110 installed within device 100 prior to aligning component with opening 122. In addition to first rail member 142 and second rail member 144, first substrate 140 may include additional alignment features. For example, as shown in FIG. 10, first substrate 140 includes first slot 117 and second slot 119 configured to receive first protrusion 147 and second protrusion 149, respectively, of component 110 in order to further align component 110 with opening 122. First slot 117 and second slot 119 could be any shape configured to receive first protrusion 147 and second protrusion 149. In some embodiments, component 110 is configured to traverse relative to first slot 117 and second slot 119 in order to engage opening 122. In the embodiment shown in FIG. 10, both component 110 and first substrate 140 traverse relative to, for example, enclosure 120. In this manner, the rail member and the protrusions along with first substrate 140.

In some embodiments, first substrate 140 includes two or fewer protrusions. In other embodiments, first substrate 140 includes four or more protrusions. Also, in some embodiments, first substrate 140 includes one or fewer rail members. In other embodiments, first substrate 140 includes three or more rail members. Still, in other embodiments, a third rail member (not shown) may be positioned on first substrate 140 proximate to first protrusion 145.

In order to actuate rear member 130 and component 110 toward opening 122, tool 170 is inserted into cavity 116 of component and rear member 130, as shown in FIG. 11. Tool 170 is selected such that rear member 130 may receive tool 170 in a manner to actuate rear member 130.

When tool 170 is inserted into rear member 130, tool 170 rotates rear member 130 around longitudinal axis 180 of rear member 130, which in turn actuates component 110 along longitudinal axis 180 in a direction toward opening 122, as shown in FIG. 12. Also, FIG. 12 shows first end 112 having a shape corresponding to opening 122. First end 112 may include additional structure that engages an inner portion of enclosure 120 such that a portion of first end 112 and/or ring element 113 may fit within enclosure 122. In some embodiments, first end 112 and/or ring element 113 are co-planar, or flush, with an outer surface of enclosure 120. In the embodiment shown in FIG. 12, first end 112 and ring element 113 are partially within opening 122. Generally, first end 112 and/or ring element 113 do not protrude outward in a manner such that first end 112 and/or ring element 113 are exterior with respect to opening 122.

Figure 13:
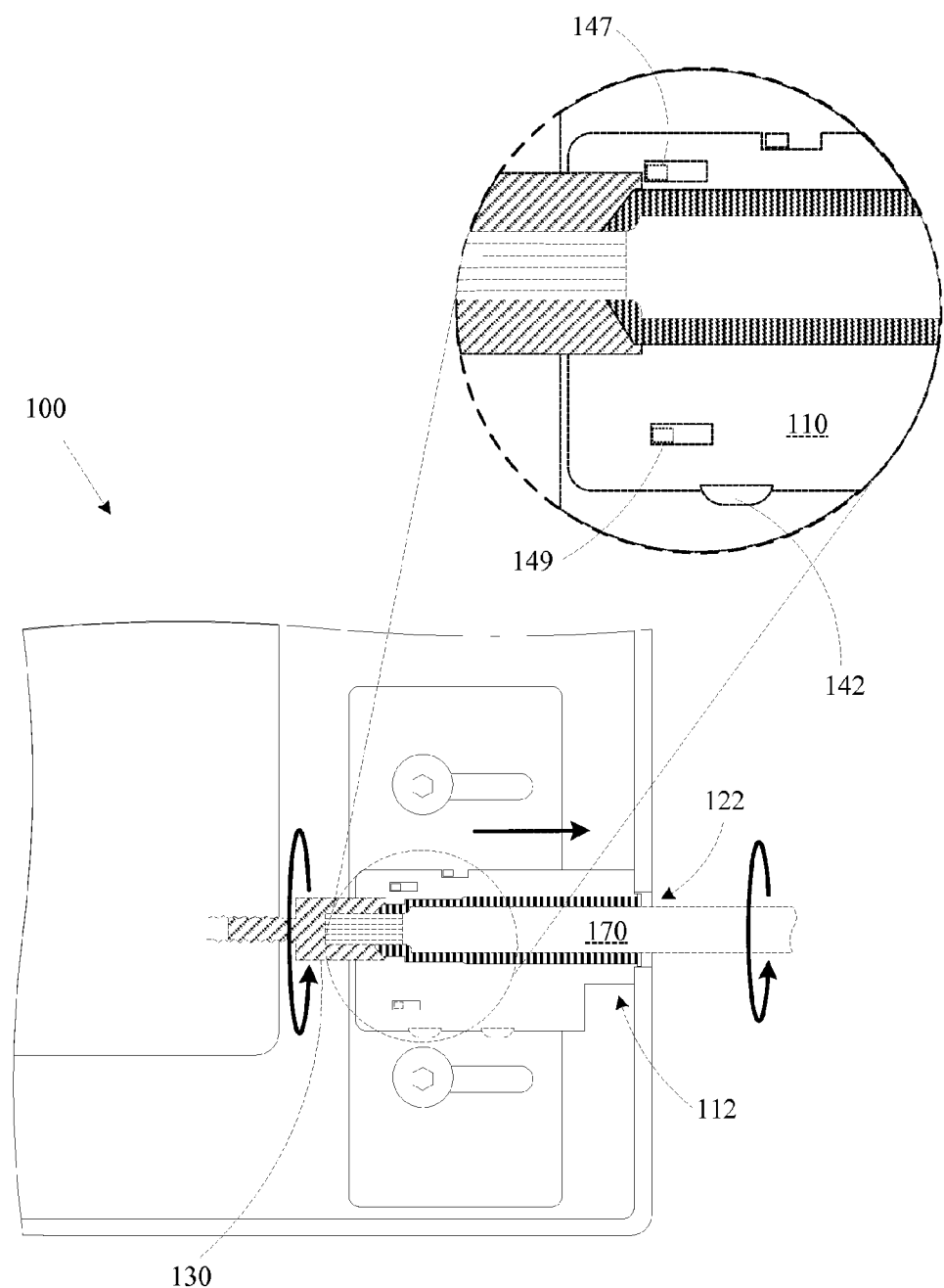
FIG. 13 illustrates an alternate embodiment of a device having an component that traverses relative to a first substrate.

FIG. 13 described an alternate embodiment in which device 100 includes component 110 that moves relative to first substrate 140. As shown in the enlarged view of FIG. 13, component 110 traverses with respect to first guide rail 142, first slot 117 and second slot 119. In this manner, tool 170 actuates rear member 130 in order to drive component 110 such that first end engages opening 122 in similar manner previously described.

In some embodiments, tool 170 is actuated manually. In other embodiments, tool 170 is actuated by automated means. In some embodiments, the automated means may include actuating to a predetermined torque. This may ensure proper movement of component 110 and/or ensure against over-torque of component 110. Also, while the embodiments of tool 170 and rear member 130 may be shown as rotating in one direction (for example, counter-clockwise), in some embodiments, tool 170 and rear member 130 may also rotate in the opposite direction (for example, clockwise). Rear member 130 may be configured to rotate in any direction such that when rotated by tool 170, rear member 130 traverses in a direction toward opening 122. Also, in some embodiments, rear member 130 may further be configured to be rotated such that rear member 130 traverses in a direction away from opening 122, or alternatively, in a direction toward internal component 160.

This additional flexibility allows for easily disassembly when needed (for example, a rework).

Figure 14:
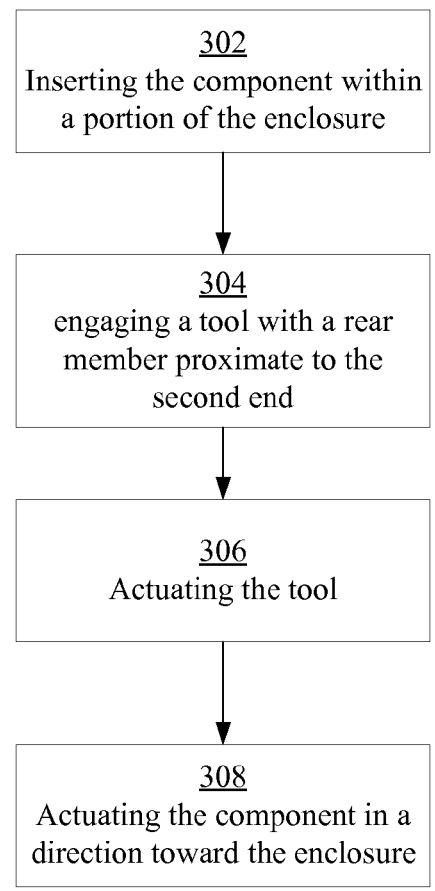
FIG. 14 illustrates a flow chart showing a method of aligning a component in an enclosure of an electronic device.

FIG. 14 illustrates a flow chart 300 showing a method of aligning a component in an enclosure of an electronic device. In step 302, the component is inserted within a portion of the enclosure. The component includes a first end and a second end opposite the first end. The first end and the second end may both open into a cavity. In step 304, a tool is engaged with a rear member proximate to the second end. The rear member is generally positioned behind the second end. Then in step 306, the tool is actuated which then actuates the rear member. In some embodiments, actuating the tool includes rotating the tool, and accordingly, rotating the rear member. Then in step 308, the component is actuated in a direction toward the enclosure. In some embodiments, actuating the component includes driving the component linearly along a first substrate below the component. The first end of the component is aligned with an opening in the enclosure such that a portion of the first end is within the opening.

Figure 15:
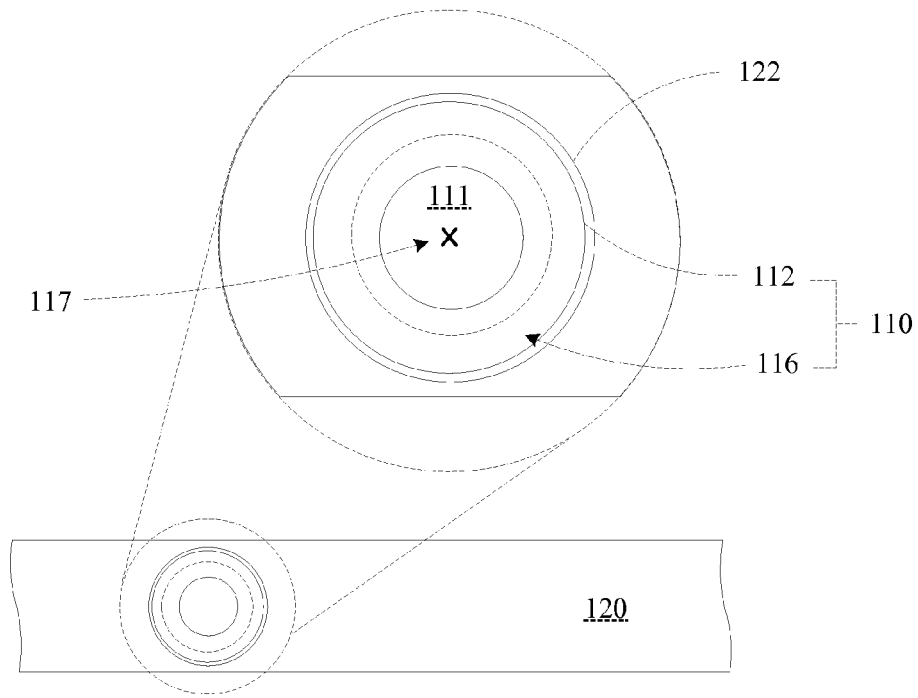
FIG. 15 shows a front view of an component properly aligned with an enclosure of an electronic device.

FIG. 15 illustrates a side view of an embodiment of a component properly aligned within enclosure 120. In particular, the enlarged view shows component 110 having opening 111 (to receive the tool previously described), first end 112, and cavity 116 that are generally concentric with opening 122 of enclosure 120. In other words, opening 111, first end 112, cavity 116, and opening 122 share a common center 117. Once component 110 is aligned with opening 122 of enclosure 120 in a desired manner, rear member 130 may be configured to lock in place such that component 110 cannot traverse in a direction away from opening 122. Locking means may include an adhesive layer positioned between first end 112 and enclosure 120. Also, a thread locker may be used in portions where the rear member is in threaded engagement with the internal component in order to prevent further rotation of the rear member after component 110 is aligned.

When first end 112, cavity 116, and opening 122 do not share a common center, then first end 112 and/or cavity 116 are offset with respect to opening 112. If first end 112 and/or cavity 116 are offset beyond a predetermined tolerance, the alignment procedure previously described did not properly align component 110.

Figure 16:
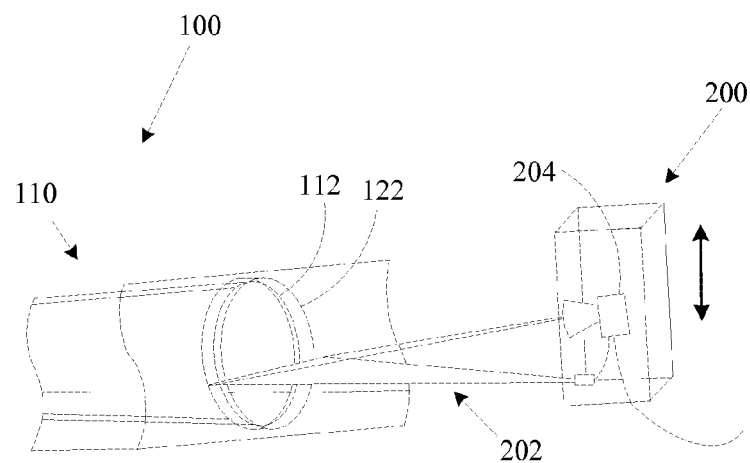
FIG. 16 shows an embodiment of a device used to measure alignment and/or offset of a component with respect to an enclosure.

There are several methods for confirming whether component 110 is properly aligned with opening 122. For example, FIG. 16 illustrates a 2D laser scanner 200, or simply scanner 200. Scanner 200 is exterior to device 100, and configured to vertically scan at least a portion of opening 122 and first end 112. Also, scanner 200 emits a two-dimensional, broad laser beam 202, or simply laser beam 202, in a direction toward opening 122 and component 110. Camera 204 within scanner 200 may capture images of laser beam 202 against opening 122 and/or first end 112. In some embodiments, scanner 200 is programmed with a predetermined profile of a properly aligned opening 122 and first end 112. After vertically scanning opening 122 and first end 112, the profile of opening 122 and first end 112 is compared with the predetermined profile, and a determination is made whether opening 122 and first end 112 are within a predetermined tolerance. Scanner may trigger a "pass" event if alignment within a certain tolerance is detected. Otherwise, a "fail" event is triggered. In other embodiments, camera 204 sends images to a computing device (not shown) for image processing and determining of proper alignment.

Other techniques may be used to confirm proper alignment. For example, a 1D laser may be used. Also, any plug (e.g., an audio plug) configured to engage the connector aligned by the described method may be inserted to ensure the component properly receives the plug which may also confirm the connector is properly aligned. Also, a manual observation may confirm whether the component is properly aligned.

There are several advantages to using an externally accessible component capable of being actuated, as previously described. For example, minimal compensation, if any, of design specifications of an enclosure is required because the component does not need to be fully aligned when installed. In other words, the enclosure may be formed without regard to the component. Also, the alignment process may be used as a fine tuning of the component to ensure a more consistent device is manufactured.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A self-aligning component for an enclosure of an electronic device, the self-aligning component comprising:
    a body defining a cavity extending from a first end of the component to a second end of the component; and
    a rear member;
    wherein the second end is engaged with the rear member in the electronic device; and
    wherein the body traverses from a first position to a second position when a tool engages and actuates the rear member.

2. The self-aligning component as recited in claim 1, wherein the enclosure is a uni-body enclosure.

3. The self-aligning component as recited in claim 1, wherein the body is an audio jack.

4. The self-aligning component as recited in claim 1, wherein the rear member includes an internal shape corresponding to the tool.

5. The self-aligning component as recited in claim 1, wherein the rear member engages an internal component of the electronic device other than the body.

6. The self-aligning component as recited in claim 1, wherein the first end is partially engaged with an opening of the enclosure.

7. The self-aligning component as recited in claim 1, wherein the second end includes a shape that corresponds to a shape of the rear member such that a portion of the second is received by the rear member.

8. The self-aligning component as recited in claim 1, wherein the tool is selected from a T5 screwdriver, a Philips screwdriver, or an Allen wrench.

9. The self-aligning component as recited in claim 1, wherein the body is positioned on a first substrate, the first substrate include a first rail that guides the body from the first position to the second position.

10. The self-aligning component as recited in claim 9, wherein:
    the body includes a first protrusion;
    the first substrate includes a first slot; and
    the first slot receives the first protrusion.

11. The self-aligning component as recited in claim 1, wherein the rear member is a set screw.

12. A method of aligning a component in an enclosure of an electronic device, the method comprising:
inserting the component within a portion of the enclosure, the component having a first end and a second end opposite the first end, the first end having a first opening that opens to a cavity;
engaging a tool with a rear member proximate to the second end;
actuating the tool, wherein the actuating the tool actuates the rear member; and
actuating the component in a direction toward the enclosure.

13. The method as recited in claim 12, further comprising removing the tool.

14. The method as recited in claim 12, wherein the tool is initially exterior with respect to the electronic device, and wherein the inserted into an opening of the enclosure.

15. The method as recited in claim 12, further comprising aligning the first opening of the component with an opening of the enclosure, wherein the first opening is smaller than the opening of the enclosure.

16. The method as recited in claim 12, further comprising locking the rear member subsequent to the actuating the component in a direction toward the enclosure.

17. An electronic device having a movable member configured to align after the movable member is installed, the electronic device comprising:
a component comprising:
a first end;
a second end opposite the first end; and
a cavity extending between the first end and the second end;
an enclosure having an opening that receives a portion of the first end;
a rear member engaged with the second end; and
wherein the component moves along a substrate in the electronic device when a rotary tool rotates the rear member.

18. The electronic device as recited in claim 17, wherein the rear member comprises internal threads.

19. The electronic device as recited in claim 17, wherein:
the first end includes a first opening;
the second end includes a second opening; and
the first opening is larger than the second opening.

20. The electronic device as recited in claim 17, wherein the cavity is concentric with respect to an opening of an enclosure of the electronic device.

* * * * *